(12) United States Patent
Sapozhnikov et al.

(10) Patent No.: US 9,659,586 B1
(45) Date of Patent: May 23, 2017

(54) READER WITH FREE LAYER EXPERIENCING OPPOSITE PHASE-SHIFTED MEDIA TORQUES

(71) Applicant: Seagate Technology LLC, Cupertino, CA (US)

(72) Inventors: Victor B. Sapozhnikov, Minnetonka, MN (US); Mohammed Shariat Ullah Patwari, Eden Prairie, MN (US); Scott Wilson Stokes, Brooklyn Park, MN (US)

(73) Assignee: Seagate Technology LLC, Cupertino, CA (US)

(*) Notice: Subject to any disclaimer, the term of this patent is extended or adjusted under 35 U.S.C. 154(b) by 0 days.

(21) Appl. No.: 14/939,647

(22) Filed: Nov. 12, 2015

(51) Int. Cl.
G11B 5/39 (2006.01)

(52) U.S. Cl.
CPC .......... *G11B 5/3932* (2013.01); *G11B 5/3912* (2013.01)

(58) Field of Classification Search
None
See application file for complete search history.

(56) References Cited

U.S. PATENT DOCUMENTS

| | | | |
|---|---|---|---|
| 5,408,377 A * | 4/1995 | Gurney | B82Y 10/00 324/252 |
| 5,920,446 A * | 7/1999 | Gill | B82Y 10/00 360/324 |
| 6,201,673 B1 * | 3/2001 | Rottmayer | B82Y 10/00 360/324.12 |
| 6,259,586 B1 * | 7/2001 | Gill | B82Y 10/00 360/314 |
| 6,714,446 B1 | 3/2004 | Engel | |
| 6,771,472 B1 | 8/2004 | Mao et al. | |
| 6,898,112 B2 | 5/2005 | Janesky et al. | |
| 7,057,865 B1 | 6/2006 | Mao et al. | |
| 7,235,408 B2 | 6/2007 | Janesky et al. | |
| 7,715,154 B2 | 5/2010 | Covington et al. | |
| 7,965,543 B2 | 6/2011 | Slaughter et al. | |
| 8,227,023 B1 | 7/2012 | Liu et al. | |
| 8,349,622 B2 | 1/2013 | Ikegawa et al. | |
| 8,451,567 B2 | 5/2013 | Zhou et al. | |
| 8,674,466 B2 | 3/2014 | Guo | |
| 8,860,156 B2 | 10/2014 | Beach et al. | |
| 9,076,468 B1 * | 7/2015 | Keener | G11B 5/3932 |
| 9,087,633 B2 | 7/2015 | Khvalkovskiy et al. | |
| 9,378,761 B1 * | 6/2016 | Seagle | G11B 5/3932 |
| 2001/0009063 A1 * | 7/2001 | Saito | B82Y 10/00 29/603.08 |
| 2009/0262465 A1 | 10/2009 | Hatatani et al. | |
| 2012/0087045 A1 * | 4/2012 | Yanagisawa | B82Y 25/00 360/294 |

(Continued)

*Primary Examiner* — Will J Klimowicz
(74) *Attorney, Agent, or Firm* — Westman, Champlin & Koehler, P.A.

(57) ABSTRACT

A read sensor that includes an unbalanced synthetic antiferromagnetic (SAF) free layer structure. The unbalanced SAF free layer structure includes a first magnetic layer having a first magnetic moment value and a second magnetic layer having a second magnetic moment value that is different from the first magnetic moment value. A separation layer is included between the first magnetic layer and the second magnetic layer. The first magnetic layer and the second magnetic layer are antiferromagnetically coupled.

20 Claims, 8 Drawing Sheets

(56) References Cited

U.S. PATENT DOCUMENTS

| | | | |
|---|---|---|---|
| 2012/0087046 A1* | 4/2012 | Yanagisawa | G01R 33/098 360/294 |
| 2014/0153137 A1* | 6/2014 | McKinlay | G11B 5/3912 360/235.4 |
| 2014/0153138 A1* | 6/2014 | Le | G11B 5/3909 360/294 |
| 2015/0147481 A1* | 5/2015 | Braganca | C25D 5/48 427/529 |
| 2015/0154991 A1* | 6/2015 | Le | G11B 5/3906 360/97.11 |
| 2015/0221325 A1* | 8/2015 | Ho | G11B 5/3912 360/125.03 |
| 2015/0325260 A1* | 11/2015 | Singleton | G11B 5/3932 360/319 |

\* cited by examiner

READER WITH FREE LAYER EXPERIENCING OPPOSITE PHASE-SHIFTED MEDIA TORQUES

BACKGROUND

Data storage devices commonly have a recording head that includes a read transducer that reads information from a data storage medium and a write transducer that writes information to a data storage medium.

In magnetic data storage devices such as disc drives, a magnetoresistive (MR) sensor such as a Giant Magnetoresistive (GMR) sensor or a Tunnel Junction Magnetoresistive (TMR) sensor may be employed as the read transducer to read a magnetic signal from the magnetic media. The MR sensor has an electrical resistance that changes in response to an external magnetic field. This change in electrical resistance can be detected by processing circuitry in order to read magnetic data from the adjacent magnetic media.

With ever-increasing levels of recording density in disc drives and a need for faster data transfer speeds, the read transducer needs to have correspondingly better data-reproducing capabilities.

SUMMARY

The present disclosure relates to a reader that addresses challenges posed by greater data density requirements and faster data transfer speeds. In one embodiment, a read sensor that includes an unbalanced synthetic antiferromagnetic (SAF) free layer structure is provided. The unbalanced SAF free layer structure includes a first magnetic layer having a first magnetic moment value and a second magnetic layer having a second magnetic moment value that is different from the first magnetic moment value. A separation layer is included between the first magnetic layer and the second magnetic layer. The first magnetic layer and the second magnetic layer are antiferromagnetically coupled.

Other features and benefits that characterize embodiments of the disclosure will be apparent upon reading the following detailed description and review of the associated drawings.

DETAILED DESCRIPTION OF ILLUSTRATIVE EMBODIMENTS

Embodiments described below relate to free layer structures included in magnetoresistive (MR) sensors that are designed to addresses challenges posed by greater data density requirements. However, prior to providing details regarding the different embodiments, a description of an illustrative operating environment is provided below.

Figure 1:
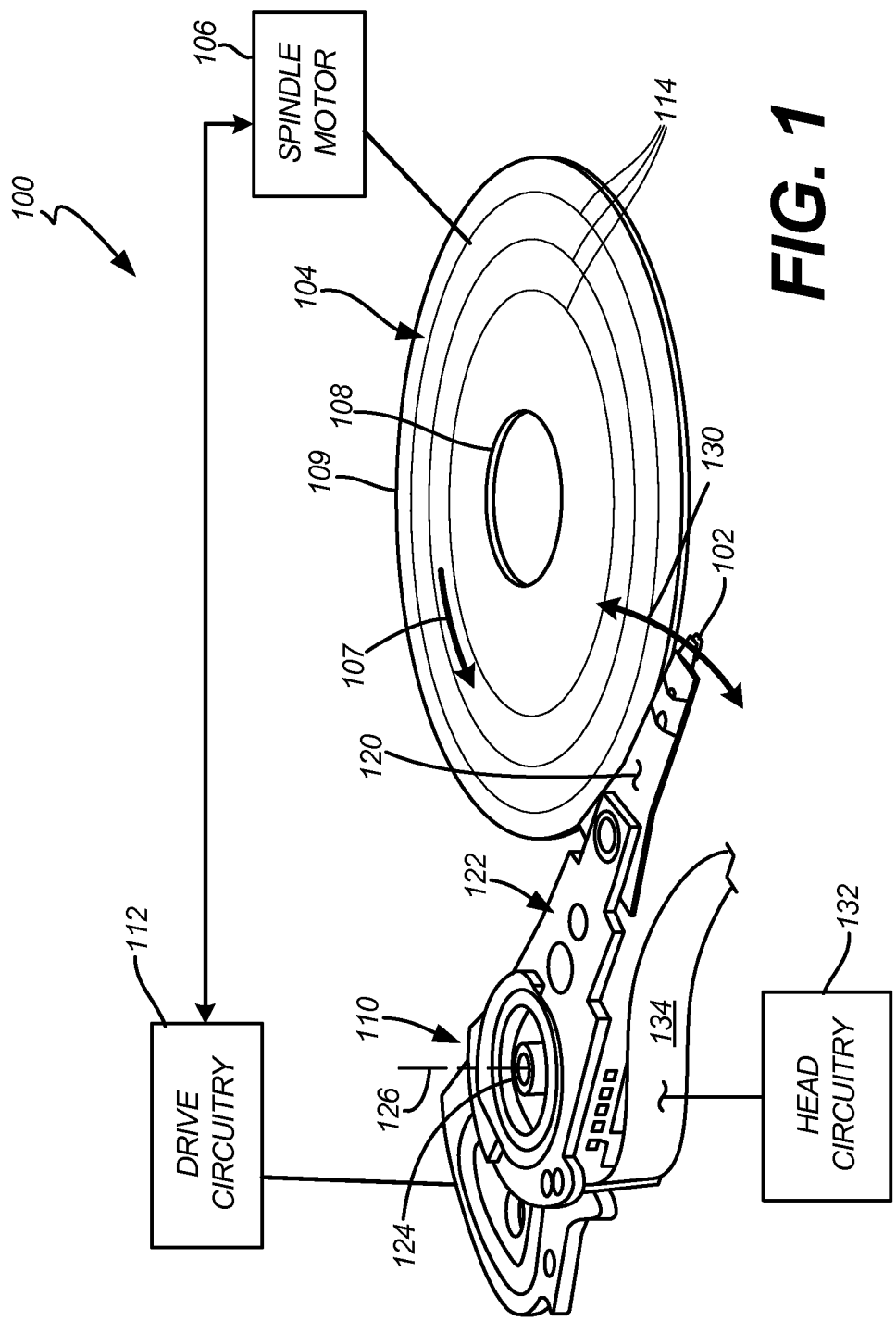
FIG. 1 is a schematic illustration of a data storage system including a data storage medium and a head for reading data from and/or writing data to the data storage medium.

FIG. 1 shows an illustrative operating environment in which certain specific embodiments disclosed herein may be incorporated. The operating environment shown in FIG. 1 is for illustration purposes only. Embodiments of the present disclosure are not limited to any particular operating environment such as the operating environment shown in FIG. 1. Embodiments of the present disclosure are illustratively practiced within any number of different types of operating environments. It should be noted that the same reference numerals are used in different figures for same or similar elements.

FIG. 1 is a schematic illustration of a data storage device 100 including a data storage medium and a head for reading data from and/or writing data to the data storage medium. In data storage device 100, head 102 is positioned above storage medium 104 to read data from and/or write data to the data storage medium 104. In the embodiment shown, the data storage medium 104 is a rotatable disc or other magnetic storage medium that includes a magnetic storage layer or layers. For read and write operations, a spindle motor 106 (illustrated schematically) rotates the medium 104 as illustrated by arrow 107 and an actuator mechanism 110 positions the head 102 relative to data tracks 114 on the rotating medium 104 between an inner diameter 108 and an outer diameter 109. Both the spindle motor 106 and actuator mechanism 110 are connected to and operated through drive circuitry 112 (schematically shown). The head 102 is coupled to the actuator mechanism 110 through a suspension assembly which includes a load beam 120 connected to an actuator arm 122 of the mechanism 110 for example through a swage connection. Although FIG. 1 illustrates a single load beam coupled to the actuator mechanism 110, additional load beams 120 and heads 102 can be coupled to the actuator mechanism 110 to read data from or write data to multiple discs of a disc stack. The actuator mechanism 110 is rotationally coupled to a frame or deck (not shown) through a bearing 124 to rotate about axis 126. Rotation of the actuator mechanism 110 moves the head 102 in a cross track direction as illustrated by arrow 130.

The head 102 includes one or more transducer elements (not shown in FIG. 1) coupled to head circuitry 132 through flex circuit 134. Details regarding elements of a head such as 102 are provided below in connection with FIG. 2.

Figure 2:
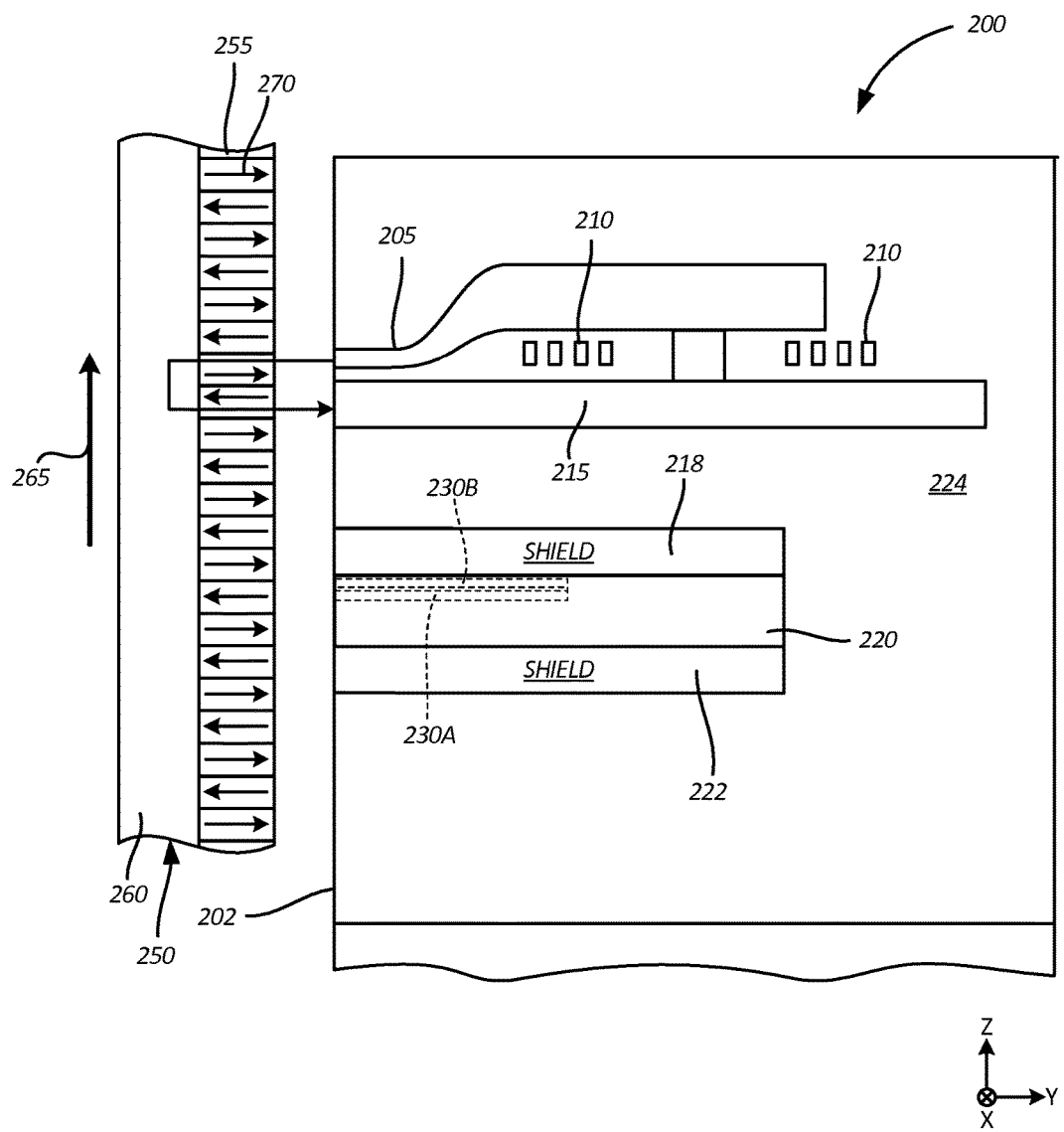
FIG. 2 is a schematic diagram of a cross-section of one embodiment of a recording head that reads from and writes to a storage medium.

FIG. 2 is a schematic diagram showing a cross-sectional view of portions of a recording head 200 and a data storage medium 250 taken along a plane substantially normal to a plane of a bearing surface (for example, an air bearing surface (ABS)) 202 of recording head 200. The recording head elements shown in FIG. 2 are illustratively included in a recording head such as recording head 102 in FIG. 1. Medium 250 is illustratively a data storage medium such as medium 104 in FIG. 1. Those skilled in the art will recognize that recording heads and recording media commonly include other components. Embodiments of the present disclosure are not limited to any particular recording heads or media. Embodiments of the present disclosure may be practiced in different types of recording heads and media.

Recording head 200 includes a write pole 205, a magnetization coil 210, a return pole 215, a top shield 218, a read transducer 220, a bottom shield 222 and a wafer overcoat 224. Storage medium 250 includes a recording layer 255 and an underlayer 260. Storage medium 250 rotates in the direction shown by arrow 265. Arrow 265 is illustratively a direction of rotation such as arrow 107 in FIG. 1.

In an embodiment, electric current is passed through coil 210 to generate a magnetic field. The magnetic field passes from write pole 205, through recording layer 255, into underlayer 260, and across to return pole 215. The magnetic field illustratively records a magnetization pattern 270 in recording layer 255. Read transducer 220 senses or detects magnetization patterns in recording layer 255, and is used in retrieving information previously recorded to layer 255.

As noted above, with ever-increasing levels of recording density in disc drives and a need for faster data transfer speeds, the read transducer needs to have correspondingly better data-reproducing capabilities. Pulse width or PW50, which is a width of a read pulse at 50% of its peak amplitude, determines reader down-track resolution and therefore serves as a measure of the potential maximum linear density. A transition that is wider leads to a larger PW50. Thus, a lower PW50 is favorable for higher linear density. Accordingly, much effort has been put into PW50 reduction. Shield-to-shield spacing (SSS) (for example, a spacing between top shield 218 and bottom shield 222) is a main parameter that impacts PW50. A large body of work has already been carried out to push SSS as low as possible and therefore further SSS reduction is getting progressively harder to achieve. Thus, any other techniques of modifying a reader design for PW50 reduction are very valuable.

Embodiments of this disclosure reduce PW50 by exposing a free layer or sensing layer of the read transducer 220 to a negative torque with a phase shift. As will be described further below, in some embodiments, this is carried out by building the free layer with an unbalanced synthetic antiferromagnetic (SAF) structure instead of utilizing a traditional solid/bulk free layer. A weaker portion of the unbalanced SAF free layer creates the negative torque with a phase shift relative to a phase of a nominal readback signal produced by, for example, a reader having a conventional solid/bulk free layer.

Figure 4A:
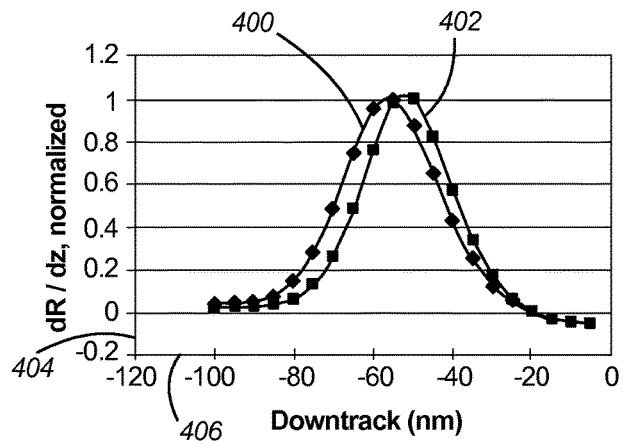
FIGS. 4A-4C are plots of results obtained using a conventional reader and readers in accordance with different embodiments.
Figure 4B:
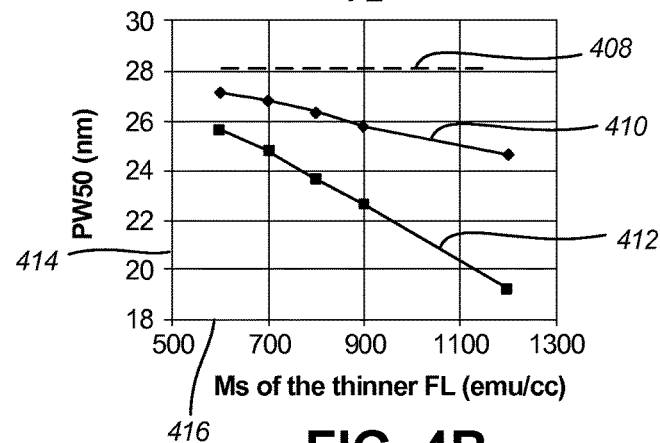
Figure 4C:
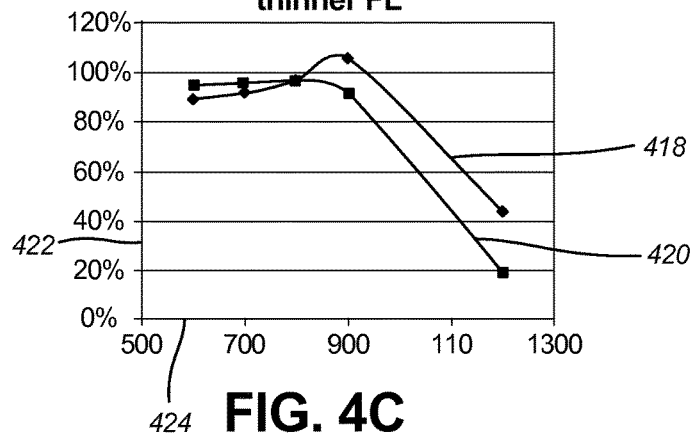
Figure 5:
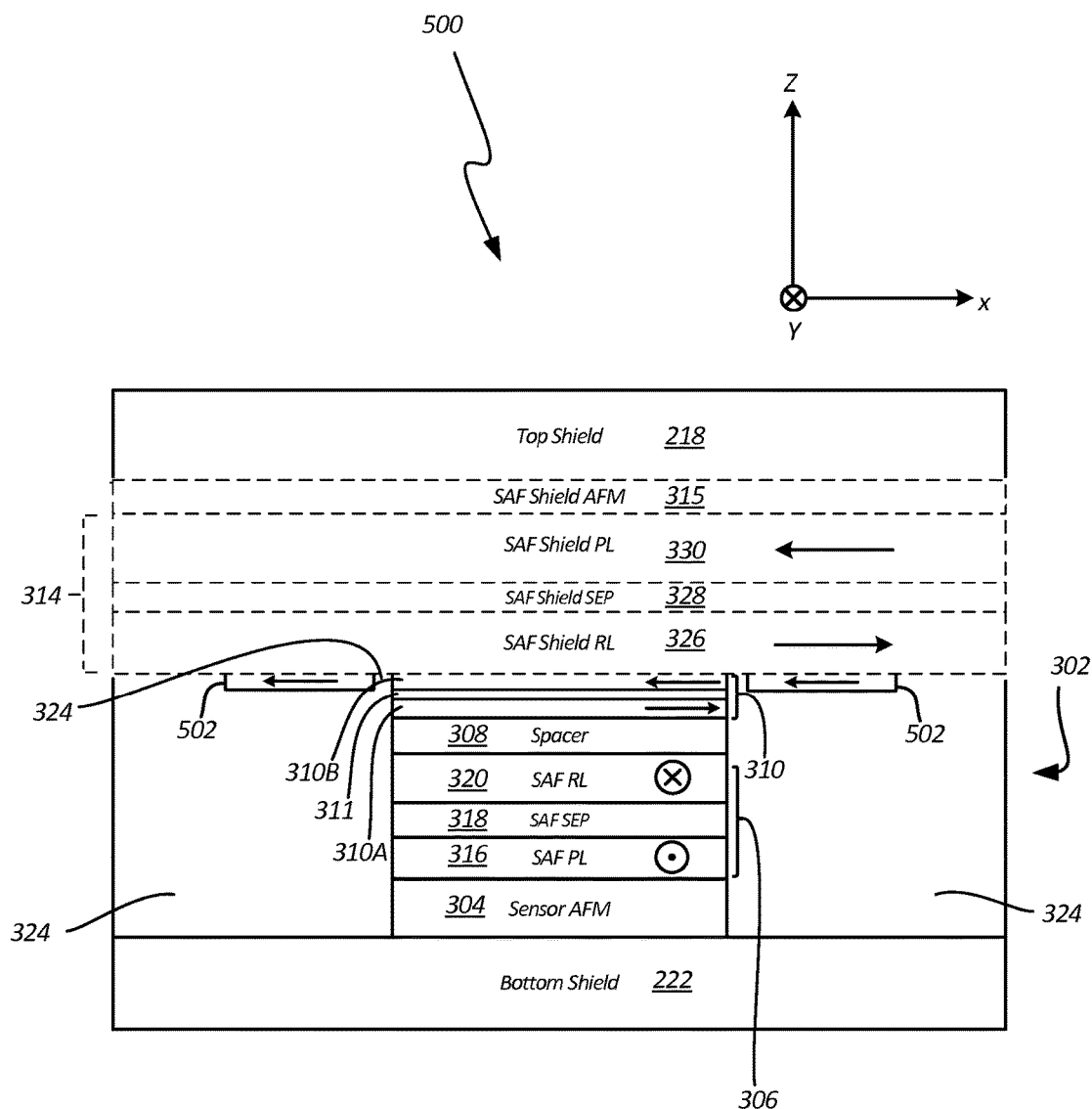
FIG. 5 is a bearing surface view of a read head including a free layer structure that is biased by a first type of biasing structure.
Figure 6:
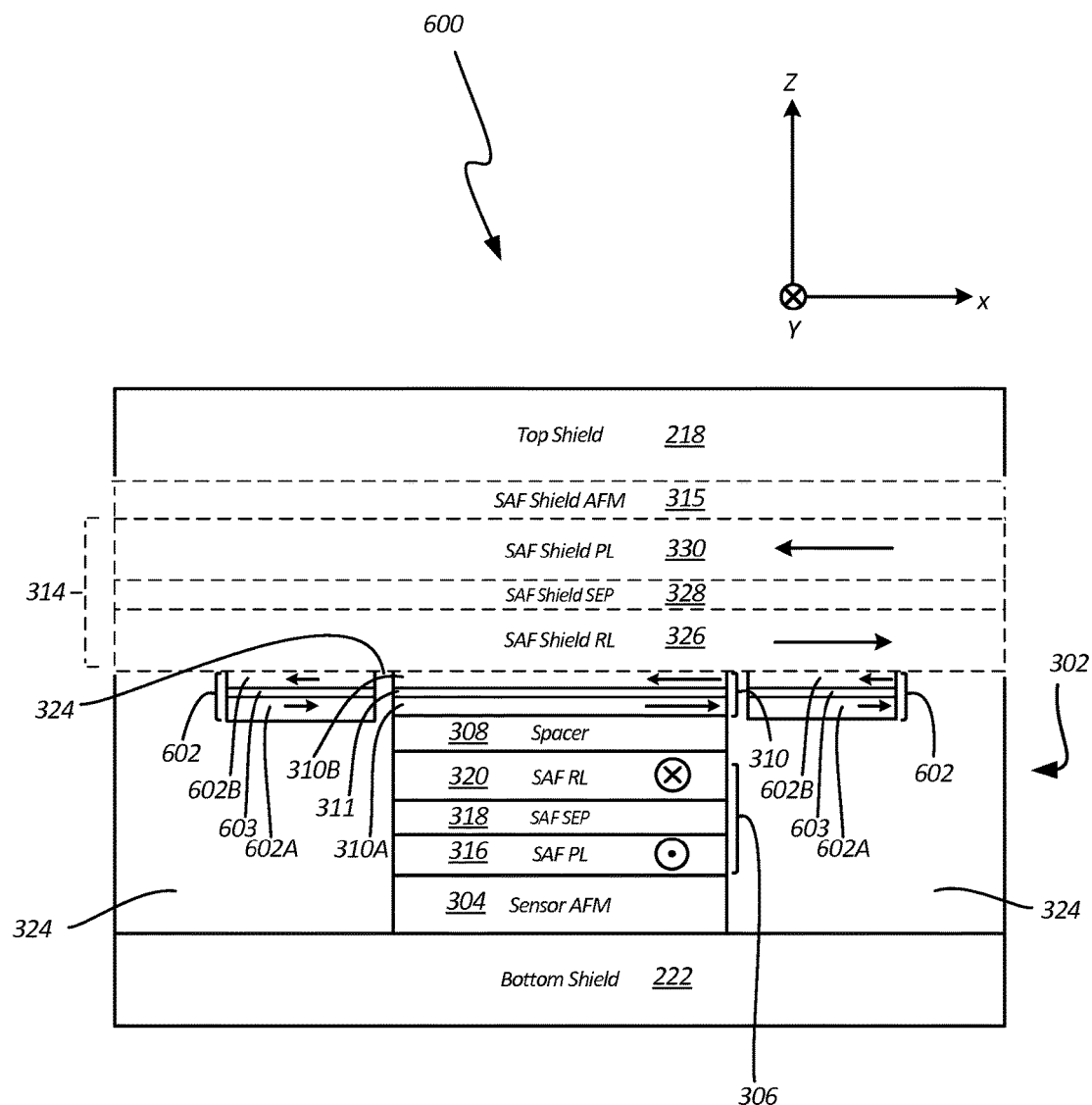
FIG. 6 is a bearing surface view of a read head including a free layer structure that is biased by a second type of biasing structure.
Figure 7:
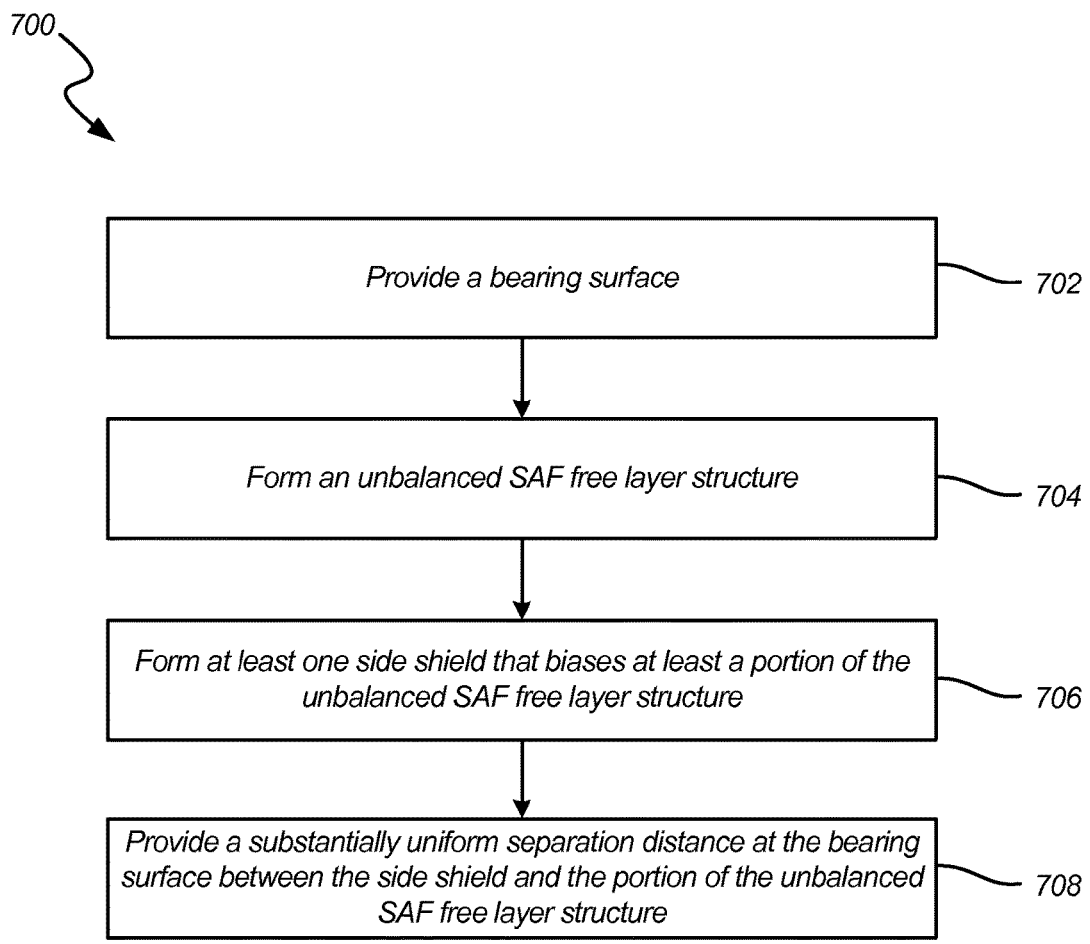
FIG. 7 is a flow diagram of a method embodiment.

In the embodiment shown in FIG. 2, read transducer 220 includes a SAF free layer structure 230 having individual free layers 230A and 230B that may be stacked along a track direction (i.e., a z-direction in FIG. 2). A track width direction is perpendicular to the track direction (i.e., a cross-track direction, which is an x-direction in FIG. 2). A y-direction in FIG. 2 is then defined as a direction that is perpendicular to x and z simultaneously, which is a stripe-height direction. A bearing surface view of one reader embodiment having an unbalanced SAF free layer structure is described below in connection with FIG. 3A. A sectional view of that reader embodiment is shown in FIG. 3B, and different torques produced by such a reader are shown in FIG. 3C. Thereafter, plots comparing results produced by a conventional reader with a solid/bulk shield and a reader with an unbalanced SAF free layer structure are shown in FIGS. 4A-4C. FIGS. 5 and 6 show different biasing structures that may be utilized for an unbalanced SAF free layer structure, and FIG. 7 is a simplified flow diagram of a method embodiment.

Figure 3A:
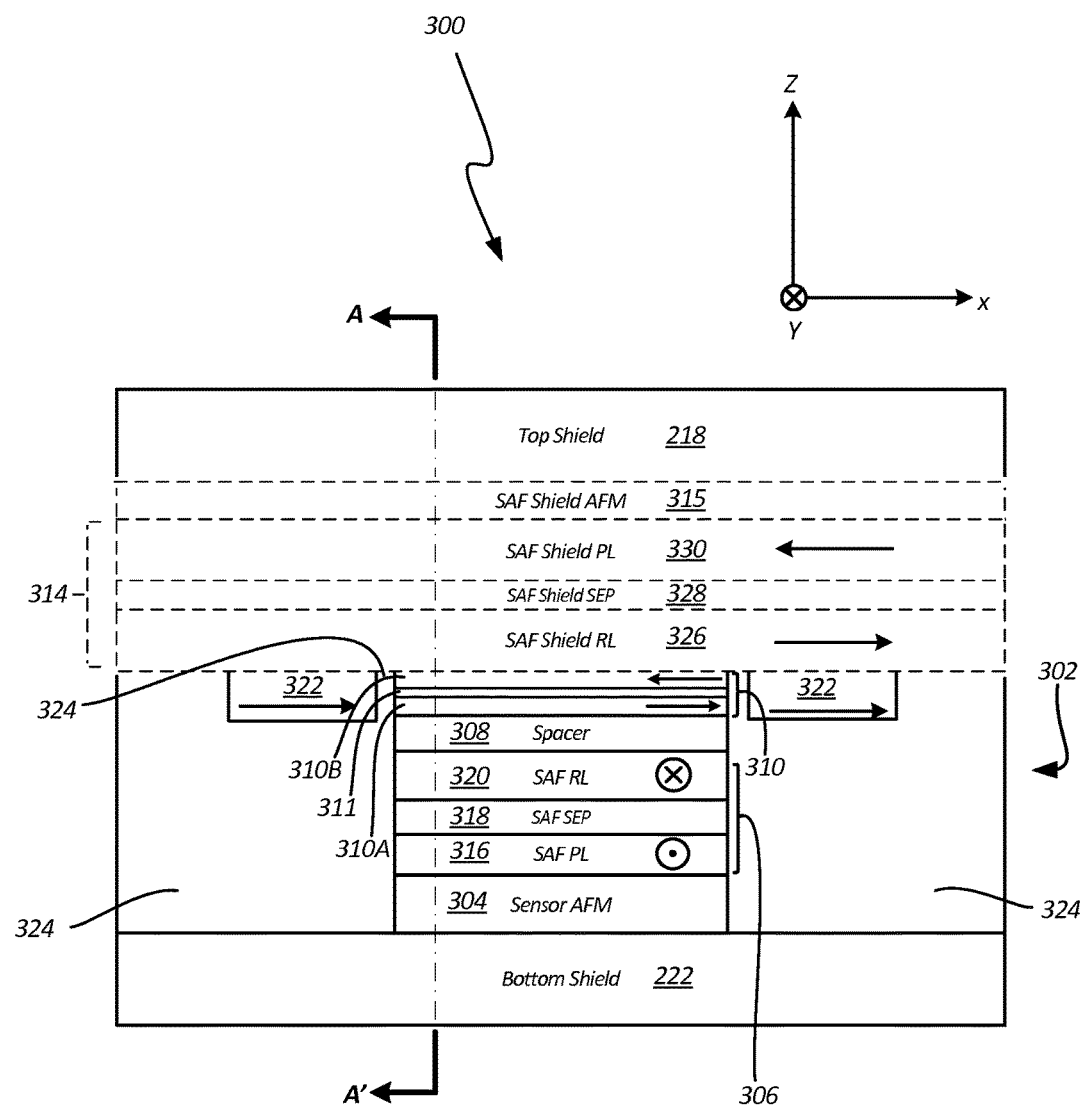
FIG. 3A is a bearing surface view of a magnetic reproducing device in accordance with one embodiment.
Figure 3B:
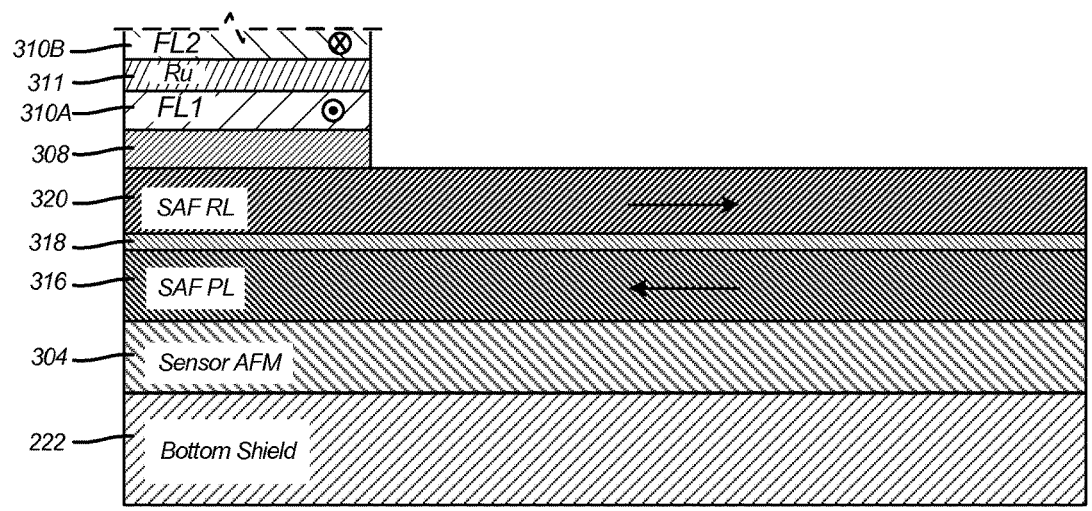
FIG. 3B is a close-up sectional view of a portion of the embodiment of FIG. 3A.
Figure 3C:
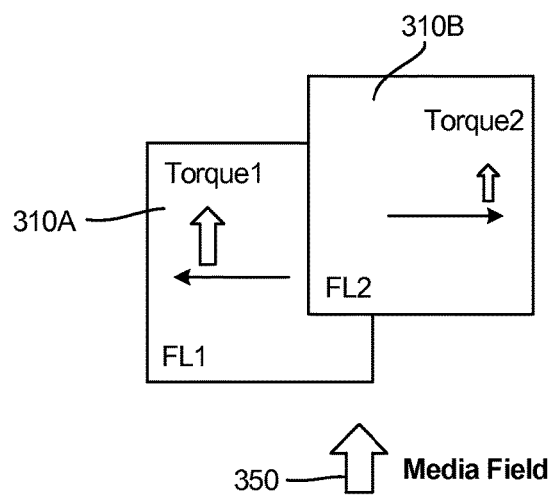
FIG. 3C is a diagrammatic illustration showing torques produced in different portions of a free layer structure of the embodiment of FIG. 3A.

FIG. 3A is a schematic block diagram illustrating a bearing surface view of an example embodiment of read head 300 including an unbalanced SAF free layer structure. FIG. 3B is a sectional view along line A-A' of FIG. 3A of portions of read head 300. Referring to FIGS. 3A and 3B, read head 300 includes a magnetoresistive sensor 302 that is positioned between top shield 218 and bottom shield 222. Top and bottom shields 218 and 222, which may be made of a material having high magnetic permeability, reduce or substantially block extraneous magnetic fields, such as, for example, those from adjacent bits on data discs from impacting the magnetoresistive sensor 302, thus improving the performance of the magnetoresistive sensor 302. In one implementation, the top and bottom shields 218 and 222 permit magnetic fields from the bit directly under magnetoresistive sensor 302 to affect the magnetoresistive sensor 302, and thus be read.

The magnetoresistive sensor 302 includes a plurality of layers including a sensor antiferromagnetic (AFM) layer 304, a sensor stack synthetic antiferromagnetic (SAF) structure 306, a spacer layer 308 and an unbalanced SAF free layer structure 310. A stack cap layer (not shown) may also be included above the unbalanced SAF free layer structure 310. An SAF shielding structure 314 and an AFM layer 315 may optionally be included above the unbalanced SAF free layer structure 310 (or above the stack cap layer if included). Dashed lines are used to represent elements of SAF structure 314 and AFM layer 315 to indicate that these structures are optional.

In the embodiment shown in FIG. 3A, the sensor SAF structure 306 includes a pinned layer 316 a thin separation layer 318, which may comprise a metal such as ruthenium (Ru) in some embodiments, and a reference layer 320. The magnetic moments of each of the pinned layer 316 and the reference layer 320 are not allowed to rotate under magnetic fields in the range of interest (for example, magnetic fields generated by the bits of data stored on the data discs). The magnetic moments of the reference layer 320 and the pinned layer 316 are generally oriented normal to the plane (i.e., the y direction) of FIG. 3A and anti-parallel to each other.

As indicated above, instead of employing a bulk/solid free layer, sensor 302 includes unbalance SAF free layer structure 310. Specifically, SAF free layer structure 310 includes a first magnetic layer 310A that has a first magnetic moment value and a second magnetic layer 310B that has a second magnetic moment value that is different from the first magnetic moment value. As used herein, a magnetic moment value refers to the product ($M_s t$) of saturation magnetization and film thickness. Thus, to obtain different magnetic moment values in layers 310A and 310B, either saturation magnetization ($M_s$) or film thickness (t) or both $M_s$ and t may be varied in any suitable manner.

A separation layer 311 is included between the first magnetic layer 310A and the second magnetic layer 310B. Separation layer 318 may comprise a metal such as ruthenium (Ru) in some embodiments. First magnetic layer 310A and second magnetic layer 310B are antiferromagnetically coupled. The magnetic moments of each of magnetic layers 310A and 310B are free to rotate under magnetic fields in the range of interest (for example, magnetic fields generated by the bits of data stored on the data discs). The magnetic moments of layers 310A and 310B and are generally oriented parallel to the plane (i.e., in the x direction) of FIG. 3A and anti-parallel to each other in the absence of magnetic fields generated by bits of data stored on the data discs.

As noted above, to obtain different magnetic moment values in layers 310A and 310B either $M_s$ or t or both $M_s$ and t may be varied in any suitable manner. Thus, in some embodiments, to provide the different magnetic moment values to individual magnetic layers 310A and 310B in unbalanced free layer structure 310, one of layers 310A and 310B may be formed of a material having a first saturation magnetization ($M_s$) value (for example, formed of NiFe) and the other one of layers 310A and 310B may be formed of a material having a second higher $M_s$ value (for example, formed of a material having a higher $M_s$ value than NiFe). In such embodiments, examples of relatively high-$M_s$ materials that can be utilized for the one of layers 310A and 310B with the $M_s$ value higher than NiFe are CoFe and CoNiFe. Of course, other high-$M_s$ magnetic materials may also be suitable to obtain the desired higher moment value. In one embodiment in which materials of different $M_s$ values are utilized to form layers 310A and 310B, respectively, a thickness of layer 310A may be approximately commensurate or substantially commensurate with a thickness of layer 310B (i.e., a thickness of the layer 310A may be equal to, slightly greater than, or slightly less than the thickness of the layer 310B). In certain other embodiments, layers 310A and 310B may be of different thicknesses and/or $M_s$ values.

In other embodiments, both layers 310A and 310B may be formed of a same material. In such embodiments, to provide the different magnetic moment values for layers 310A and 310B, respectively, one of layer 310A and 310B is formed of a first thickness and the other one of layers 310A and 310B is formed of a second thickness, which is different from the first thickness. In one such embodiment, layer 310A may have and first thickness value that is about twice the second thickness value of layer 310B. In another such embodiment, the second thickness value of layer 310B may be about twice the first thickness value of layer 310A. In general, any suitable materials and/or thickness values may be utilized for layers 310A and 310B to provide the unbalanced SAF free layer structure 310.

The read head 300 may further include side biasing magnets or side shields 322, which produce a magnetic field that helps bias one or both layers 310A and 310B of the unbalanced SAF free layer structure 310 with a magnetic moment or magnetic moments parallel to the plane of the figure and generally oriented horizontally. The one or more biases are sufficiently small, however, that the magnetic moment of the unbalanced SAF free layer structure 310 can change in response to an applied magnetic field, such as a magnetic field of a data bit stored on the data discs. In some embodiments, the side biasing magnets or side shields 322 are formed of one or more layers of soft magnetic material (i.e., material that can be easily magnetized and demagnetized at relatively low magnetic fields). The soft magnetic material may be an alloy comprising Ni and Fe. The magnetoresistive sensor 302 is separated and electrically isolated from the side biasing magnets 322 by an isolation layer 324 including, for example, insulating materials. Isolation layer 324 may also be present in other regions of head 300 as shown in FIG. 3A.

In the embodiment shown in FIG. 3A, optional SAF shielding structure 314 includes a SAF shield reference layer 326, a thin SAF shield separation layer 328, which may comprise a metal such as Ru in some embodiments, and an SAF shield pinned layer 330. Because, in some embodiments, sensor 300 utilizes soft side shields 322, SAF shield reference layer 326 needs to have a relatively fixed magnetization to assist in stabilizing the magnetizations of the side shields 322. Thus, in such embodiments, an AFM layer 315 is employed to pin the magnetization of SAF shield pinned layer 330 substantially parallel to the bearing surface, which results in the relatively fixed magnetization of SAF shield reference layer 326 due to antiferromagnetic coupling across SAF shield separation layer 328 and thus in stabilizing the magnetizations of the side shields 322 substantially parallel to the bearing surface as well. SAF shield reference layer 326 and SAF shield pinned layer 330 may be formed of a soft magnetic material (for example, an alloy comprising Ni and Fe). It should be noted that, instead of employing SAF shielding structure 314 and AFM layer 315, side shields 322 may be stabilized by shape anisotropy, by employing hard magnetic layers adjacent to the soft magnetic layers within side shield 322, or by any other suitable technique.

In some embodiments, sensor 302 may utilize tunnel magnetoresistance (TMR) or giant magnetoresistance (GMR) effects. In embodiments that utilize TMR effects, spacer layer 308 is a tunneling barrier layer that separates the SAF structure 306 from the unbalanced SAF free layer structure 310. The tunneling barrier layer 308 is sufficiently thin that quantum mechanical electron tunneling occurs between reference layer 320 in the SAF structure 306 and the unbalanced SAF free layer structure 310. The electron tunneling is electron-spin dependent, making the magnetic response of the magnetoresistive sensor 302 a function of the relative orientations and spin polarizations of the SAF structure 306 and the unbalanced SAF free layer structure 310. The highest probability of electron tunneling occurs when the magnetic moments of the SAF structure 306 and the unbalanced free layer structure 310 are parallel, and the lowest probability of electron tunneling occurs when the magnetic moments of the SAF structure 306 and the unbalanced SAF free layer structure 310 are antiparallel. Accordingly, the electrical resistance of the magnetoresistive sensor 302 changes in response to an applied magnetic field. The data bits on the data discs in the disc drive may be magnetized in a direction normal to the plane of FIG. 3A, either into the plane of the figure, or out of the plane of the figure. Thus, when the magnetoresistive sensor 302 passes over a data bit, the magnetic moments of the unbalanced SAF free layer structure 310 are rotated either into the plane of FIG. 3A or out of the plane of FIG. 3A, changing the electrical resistance of the magnetoresistive sensor 302. The value of the bit being sensed by the magnetoresistive sensor 302 (for example, either 1 or 0) may therefore be determined based on the current flowing from a first electrode (not shown) to a second electrode (not shown) connected to the magnetoresistive sensor 302.

FIG. 3C illustrates examples of media torques that are produced in layers 310A and 310B in an embodiment in which layer 310A has a higher magnetic moment value than layer 310B. In FIG. 3C, a magnetic field from the data bit(s) is denoted by reference numeral 350. As can be seen in FIG. 3C, a first torque (Torque1) produced in layer 310A is opposite to a second torque (Torque2) produced in layer 310B. Specifically, as indicated above, the weaker or relatively low-moment portion of the unbalanced SAF free layer (i.e., layer 310B) produces the second or negative torque, Torque2, with a phase shift relative to a phase of a readback signal produced by a reader including a conventional solid/bulk free layer. One example of a readback signal with such a phase shift is described below in connection with FIG. 4A.

FIG. 4A is a transition readback derivative (purse shape) graph illustrating readback pulses obtained from different readers. A first pulse shape 400 shown in FIG. 4A is obtained from a conventional reader that includes a solid/bulk free layer that is 6 nanometers (nm) thick and is formed of a material having a $M_s$ of 900 electromagnetic units (emu)/cubic centimeter (cc). A second pulse shape 402 shown in FIG. 4A is obtained from a reader that includes an unbalanced SAF free layer structure that has a first magnetic layer (such as layer 310A) that is 4 nm thick and a second magnetic layer (such as layer 310B) that is 2 nm thick. Both magnetic layers of the unbalanced SAF free layer structure are formed of a material having an Ms value of 900 emu/cc. In FIG. 4A, vertical axis 404 represents normalized dR/dz (where R is a resistance of the reader and z is a down-track distance), and horizontal axis 406 represents down-track distance in nm. A torque with a phase shift from the weaker portion of the unbalanced free layer structure (i.e., the torque produced from the 2 nm layer (such as 310B)) trims the pulse 402, thereby making it narrower relative to pulse 400.

FIG. 4B is a graph illustrating a comparison of PW50 values for different readers. A first PW50 plot 408 is for a conventional reader that has a solid/bulk free layer with a thickness value of 6 nm. A second PW50 plot 410 is for a reader that includes a first unbalanced SAF free layer structure that has a first magnetic layer (such as layer 310A) that is 4 nm thick and a second magnetic layer (such as layer 310B) that is 2 nm thick. A third PW50 plot 412 is for a reader that includes a second unbalanced SAF free layer structure that has a first magnetic layer (such as layer 310A) that is 2 nm thick and a second magnetic layer (such as layer 310B) that is 4 nm thick. In FIG. 4B, vertical axis 414 represents PW50 in nm. Horizontal axis 416 represents Ms in emu/cc of the thinner free layer for the first and second unbalanced SAF free layer structures and represents Ms in emu/cc for the solid/bulk free layer of the conventional reader. As can be seen in FIG. 4B, at Ms=900 emu/cc, PW50 improves by 2.3 nm for the first unbalanced free layer design (plot 410) relative to the conventional reader (plot 408). A greater PW50 improvement of 5 nm in obtained for the second unbalanced free layer design (plot 412) at Ms=900 emu/cc relative to the conventional reader (plot 408).

FIG. 4C is a graph illustrating readback signal amplitudes versus Ms of the thinner free layer for readers with different unbalanced SAF free layer designs. First curve 418 is for a reader having the first unbalanced free layer structure described above in connection with 4B. Second curve 420 is for a reader having the second unbalanced free layer structure described above in connection with FIG. 4B. In FIG. 4B, vertical axis 422 represents amplitudes of readback signals for the readers with the unbalanced free layers structures relative to the amplitudes of readback signals of the conventional reader described in connection with FIGS. 4A and 4B. Horizontal axis 424 represents Ms in emu/cc of the thinner free layer for the first and second unbalanced SAF free layer structures. As can be seen in FIG. 4C, both the unbalanced SAF free layer designs (curves 318 and 320) preserve amplitudes of the readback signals at an Ms value of the weaker free layer of 900 emu/cc. Thus, the unbalanced SAF free layer designs significantly improve PW50 while preserving the readback signal amplitude.

FIG. 5 is a schematic block diagram illustrating a bearing surface view of a read head 500 including an unbalanced SAF free layer structure that is biased by a first type of biasing structure. Elements of read head 500 other than the biasing structures are substantially similar to the elements of read head 300 (of FIGS. 3A and 3B). Therefore, a description of the substantially similar elements is not repeated in connection with FIG. 5. As can be seen in FIG. 5, read head 500 includes substantially thin biasing structures or side shields 502, which are substantially coplanar with layer 310B of SAF free layer structure 310. Thus, side shields 502 provide biasing primarily to layer 310B of the unbalanced free layer structure 310 with a magnetic moment parallel to the plane (i.e., in the x direction) of FIG. 5 in the absence of magnetic fields generated by bits of data stored on the data discs. It should be noted that side shields 502 may have a small biasing influence on layer 310A due to their physical proximity to that layer. In this embodiment, no side shields are positioned in a same plane as layer 310A to bias layer 310A. The magnetic moment of layer 310A in a quiescent state (i.e., in the absence of an external magnetic field) is oriented parallel to the sensor stack, and that orientation may be provided by antiferromagnetic coupling to layer 310B. In some embodiments, side shields 502 may be substantially entirely formed of a soft magnetic material such as an alloy containing Ni and Fe. However, in other embodiments, hard magnetic layers may be included within side shield 502. In general, side shields 502 may be formed of any suitable material. In the embodiment shown in FIG. 5, each side shield 502 is substantially uniformly spaced from layer 310B at the bearing surface (i.e., a spacing between each side shield 502 and layer 310B in the cross-track or x-direction does not vary along a layer thickness direction (i.e., in the down-track or z-direction) at the bearing surface). However, such substantially uniform spacing is not required in all embodiments. It should be noted that, in an alternate embodiment, side shields such as 502 may be substantially coplanar with layer 310A of SAF free layer structure 310, and therefore may provide biasing primarily to layer 310A and not to layer 310B.

FIG. 6 is a schematic block diagram illustrating a bearing surface view of a read head 600 including an unbalanced SAF free layer structure that is biased by a second type of biasing structure. Elements of read head 600 other than the biasing structures are substantially similar to the elements of read head 300 (of FIGS. 3A and 3B). Therefore, a description of the substantially similar elements is not repeated in connection with FIG. 6. In read head 600, each of side shield shields 602 is an SAF structure including two magnetic layers 602A and 602B, which are separated by layer 603 that may comprise a metal such as ruthenium (Ru) in some embodiments. Layers 602A and 602B are antiferromagnetically coupled. Layer 602A, which is substantially coplanar with layer 310A of the unbalanced free layer structure 310, provides biasing to layer 310A with a magnetic moment parallel to the plane (i.e., in the x direction) of FIG. 6 in the absence of magnetic fields generated by bits of data stored on the data discs. Similarly, layer 602B, which is substantially coplanar with layer 310B of the unbalanced free layer structure 310, provides biasing to layer 310B with a magnetic moment parallel to the plane (i.e., in the x direction) of FIG. 6 in the absence of magnetic fields generated by bits of data stored on the data discs. Any suitable magnetic materials may be utilized to form layer 602A and 602B. In the embodiment shown in FIG. 6, each side shield 602 is substantially uniformly spaced from unbalanced free layer structure 310 at the bearing surface (i.e., a spacing between each side shield 602 and structure 310 in the cross-track or x-direction does not vary along a layer thickness direction (i.e., in the down-track or z-direction) at the bearing surface). However, such substantially uniform spacing is not required in all embodiments.

FIG. 7 is a simplified flow diagram 700 of a method embodiment. At step 702, a bearing surface is provided. An unbalanced SAF free layer structure is formed at step 704. The unbalanced SAF free layer structure may include first and second antiferromagnetically coupled magnetic layers that have different magnetic moment values. At step 706, at least one side shield that is capable of biasing at least one of the first magnetic layer or the second magnetic layer is formed. At step 708, a substantially uniform separation distance at the bearing surface is provided between the at least one side shield and the at least one of the first magnetic layer or the second magnetic layer that the at least one side shield is capable of biasing. It should be noted that the method steps of flow diagram 700 may be carried out in any suitable order. Also, the different method steps of flow diagram 700 may be carried out at different points in time. For example, in some embodiments, the bearing surface of step 702 may be formed by a mechanical lapping process the may be carried out well after the remaining method steps.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be reduced. Accordingly, the disclosure and the figures are to be regarded as illustrative rather than restrictive.

One or more embodiments of the disclosure may be referred to herein, individually and/or collectively, by the term "invention" merely for convenience and without intending to limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. §1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A read sensor comprising:
a bottom shield;
an antiferromagnetic (AFM) layer over the bottom shield;
a first synthetic antiferromagnetic (SAF) structure on the AFM layer, wherein the AFM layer pins the first SAF structure;
a tunnel barrier layer on the first SAF structure;
a second SAF structure on the tunnel barrier layer, wherein the second SAF structure is an unbalanced SAF free layer structure comprising:
 a first magnetic layer on the tunnel barrier layer, the first magnetic layer having a first magnetic moment value;
 a second magnetic layer having a second magnetic moment value that is different from the first magnetic moment value; and
 a separation layer between the first magnetic layer and the second magnetic layer,
 wherein the first magnetic layer and the second magnetic layer are antiferromagnetically coupled, and
 wherein the second magnetic moment value is lower than the first magnetic moment value, and
 wherein, when under an influence of a magnetic field from a data storage medium, the first magnetic layer is configured to produce a first torque in a first direction and the second magnetic layer is configured to produce a negative second torque in a second direction that is opposite to the first direction, and
 wherein the negative second torque in the second direction produces a phase shift is a readback signal of the read sensor relative to a phase of a nominal readback signal;
a cap layer over the unbalanced SAF free layer structure; and
a top shield over the cap layer,
wherein the cap layer, the second SAF structure, the tunnel barrier layer, the first SAF structure and the AFM layer together form a single Tunnel Junction Magnetoresistive sensor.

2. The read sensor of claim 1 and wherein a thickness of the first magnetic layer is substantially commensurate with a thickness of the second magnetic layer.

3. The read sensor of claim 1 and wherein the first magnetic layer is below the separation layer and the second magnetic layer is above the separation layer, and wherein the read sensor further comprises at least one side shield configured to primarily bias only one of the first magnetic layer or the second magnetic layer.

4. The read sensor of claim 3 and further comprising a bearing surface, wherein the at least one side shield and the one of the first magnetic layer or the second magnetic layer primarily biased by the at least one side shield each comprises a magnetic orientation that is substantially parallel to the bearing surface of the read sensor.

5. The read sensor of claim 3 and further comprising a bearing surface, wherein a magnetization direction of the one of the first magnetic layer or the second magnetic layer not primarily biased by the at least one side shield is oriented substantially parallel to the bearing surface of the read sensor by antiferromagnetic coupling to the one of the first magnetic layer or the second magnetic layer primarily biased by the at least one side shield.

6. The read sensor of claim 4 and wherein the at least one side shield and the one of the first magnetic layer or the second magnetic layer primarily biased by the at least one side shield are substantially coplanar in a plane perpendicular to the bearing surface, and wherein no side shield is positioned in a same plane, perpendicular to the bearing surface, as the first magnetic layer or the second magnetic layer not primarily biased by the at least one side shield.

7. The read sensor of claim 6 and further comprising the bearing surface, wherein a separation distance between the at least one side shield and the one of the first magnetic layer or the second magnetic layer primarily biased by the at least one side shield is substantially uniform at the bearing surface.

8. The read sensor of claim 1 and further comprising at least one SAF side shield, wherein a first magnetic layer of the at least one SAF side shield is configured to bias the first magnetic layer of the unbalanced SAF free layer structure, and wherein a second magnetic layer of the SAF side shield is configured to bias the second magnetic layer of the unbalanced free layer structure.

9. The read sensor of claim 1 and wherein the first magnetic layer of the unbalanced SAF free layer structure is formed of a first material and the second magnetic layer of the unbalanced SAF free layer structure is formed of a second material that is different from the first material.

10. The read sensor of claim 9 and wherein the first magnetic material has a higher saturation magnetization value than the second magnetic material.

11. The read sensor of claim 10 and wherein the first magnetic material comprises CoFe or CoNiFe, and wherein the second magnetic material comprises NiFe.

12. A read sensor comprising:
a single Tunnel Junction Magnetoresistive sensor comprising:
a bearing surface;
an antiferromagnetic (AFM) layer;
a pinned structure on the AFM layer;
a tunnel barrier layer over the pinned structure;
an unbalanced synthetic antiferromagnetic (SAF) free layer structure on the tunnel barrier layer, the unbalanced SAF free layer structure comprising:
a first magnetic layer having a first magnetic moment value;
a second magnetic layer having a second magnetic moment value that is different from the first magnetic moment value; and
a separation layer between the first magnetic layer and the second magnetic layer,
wherein the first magnetic layer and the second magnetic layer are antiferromagnetically coupled; and
at least one side shield configured to bias at least one of the first magnetic layer or the second magnetic layer, wherein a separation distance between the at least one side shield and the at least one of the first magnetic layer or the second magnetic layer that the at least one side shield is configured to bias is substantially uniform at the bearing surface.

13. The read sensor of claim 12 and wherein the first magnetic layer is below the separation layer and the second magnetic layer is above the separation layer, and wherein the read sensor further comprises at least one side shield configured to primarily bias only one of the first magnetic layer or the second magnetic layer.

14. The read sensor of claim 13 and wherein the at least one side shield and the one of the first magnetic layer or the second magnetic layer primarily biased by the at least one side shield each comprises a magnetic orientation that is substantially parallel to the bearing surface of the read sensor.

15. The read sensor of claim 13 and wherein a magnetization direction of the one of the first magnetic layer or the second magnetic layer not primarily biased by the at least one side shield is oriented substantially parallel to the bearing surface of the read sensor by antiferromagnetic coupling to the one of the first magnetic layer or the second magnetic layer primarily biased by the at least one side shield.

16. The read sensor of claim 15 and wherein the at least one side shield and the one of the first magnetic layer or the second magnetic layer primarily biased by the at least one side shield are substantially coplanar.

17. The read sensor of claim 12 and wherein the at least one side shield comprising at least one SAF side shield, and wherein a first magnetic layer of the at least one SAF side shield is configured to bias the first magnetic layer of the unbalanced SAF free layer structure, and wherein a second magnetic layer of the SAF side shield is configured to bias the second magnetic layer of the unbalanced free layer structure.

18. The read sensor of claim 12 and wherein the first magnetic layer of the unbalanced SAF free layer structure is formed of a first material and the second magnetic layer of the unbalanced SAF free layer structure is formed of a second material that is different from the first material.

19. A method of forming a read sensor, the method comprising:
forming a single Tunnel Junction Magnetoresistive sensor by:
providing a bearing surface;
forming an antiferromagnetic (AFM) layer;
forming a pinned structure on the AFM layer:
forming a tunnel barrier layer over the pinned structure;
forming an unbalanced synthetic antiferromagnetic (SAF) free layer structure on the tunnel barrier layver, the unbalanced SAF free layer structure comprising:
a first magnetic layer having a first magnetic moment value;
a second magnetic layer having a second magnetic moment value that is different from the first magnetic moment value; and
a separation layer between the first magnetic layer and the second magnetic layer,
wherein the first magnetic layer and the second magnetic layer are antiferromagnetically coupled; and
forming at least one side shield that is capable of biasing at least one of the first magnetic layer or the second magnetic layer; and
providing, at the bearing surface, a substantially uniform separation distance between the at least one side shield and the at least one of the first magnetic layer or the second magnetic layer that the at least one side shield is capable of biasing.

20. The method of claim 19 and wherein forming the unbalanced SAF free layer structure comprises forming the first magnetic layer of a first material and forming the second magnetic layer of a second material, wherein the second material is different from the first material.

* * * * *